US009775229B1

(12) United States Patent
Haley et al.

(10) Patent No.: US 9,775,229 B1
(45) Date of Patent: Sep. 26, 2017

(54) INTERNALLY DIE-REFERENCED THERMAL TRANSFER PLATE

(71) Applicant: Nvidia Corporation, Santa Clara, CA (US)

(72) Inventors: David Haley, Santa Clara, CA (US); Carlo Galutera, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 15/414,902

(22) Filed: Jan. 25, 2017

(51) Int. Cl.
*H05K 1/02* (2006.01)
*H05K 3/30* (2006.01)
*H05K 5/00* (2006.01)

(52) U.S. Cl.
CPC ............. *H05K 1/0203* (2013.01); *H05K 3/30* (2013.01); *H05K 5/0086* (2013.01)

(58) Field of Classification Search
CPC ....... H05K 1/0203; H05K 3/30; H05K 5/0086
USPC .................................................. 361/704–721
See application file for complete search history.

(56) References Cited

U.S. PATENT DOCUMENTS

| 5,396,403 | A | * | 3/1995 | Patel ...................... H01L 23/433 257/713 |
| 5,920,120 | A | | 7/1999 | Webb et al. |
| 6,191,478 | B1 | | 2/2001 | Chen |
| 6,534,860 | B2 | * | 3/2003 | Turner .................... H01L 23/36 257/675 |
| 6,930,385 | B2 | | 8/2005 | Hsu et al. |
| 7,365,985 | B1 | * | 4/2008 | Ni ...................... H01L 23/3672 165/185 |
| 7,875,972 | B2 | | 1/2011 | Jadhav et al. |
| 8,780,561 | B2 | | 7/2014 | Danello et al. |
| 9,070,656 | B2 | | 6/2015 | Hooper et al. |
| 9,293,428 | B2 | * | 3/2016 | Sauciuc .................. H01L 24/03 |
| 9,318,410 | B2 | | 4/2016 | De Cecco et al. |
| 9,318,474 | B2 | | 4/2016 | Zhai et al. |
| 9,338,927 | B2 | * | 5/2016 | Mataya .............. H05K 7/20454 |
| 2007/0115644 | A1 | * | 5/2007 | Kim ...................... G06F 1/1626 361/720 |
| 2009/0243085 | A1 | | 10/2009 | Houle |
| 2015/0077945 | A1 | * | 3/2015 | Rhee .................... H05K 1/0296 361/720 |
| 2015/0327353 | A1 | * | 11/2015 | Dickover ............. H05K 7/2039 361/679.54 |

(Continued)

OTHER PUBLICATIONS

"HotSpot-A Chip and Package Compact Thermal Modeling Methodology for VLSI Design," A dissertation presented by Wei Huang, The Charles L. Brown Department of Electrical and Computer Engineering, University of Virginia, Jan. 2007, 156 pages.

*Primary Examiner* — Anthony Haughton
*Assistant Examiner* — Yahya Ahmad

(57) ABSTRACT

This disclosure describes an electronics device that effectively removes heat from the SoC, which increases its efficiency and extends its useful life by spreading heat in the thermally conductive plate before transferring it across the interface. Surface area is a significant factor in TIM thermal performance, so this increases the performance substantially when using the same type of TIM pad. This device allows the use of lower performance TIM pads that resolve the issues of high die pressure and non-resilient behavior of high thermal conductivity TIMs. Additionally, the device mechanically isolates the SoC from the heatsink, which reduces stress and provides improved thermal performance.

20 Claims, 4 Drawing Sheets

(56) References Cited

U.S. PATENT DOCUMENTS

2016/0086870 A1   3/2016   Abe et al.
2016/0225742 A1*  8/2016   Davis .................. H01L 25/0655

* cited by examiner

INTERNALLY DIE-REFERENCED THERMAL TRANSFER PLATE

TECHNICAL FIELD

This application is directed, in general, to an electronics device having an internally die-referenced thermal transfer plate.

BACKGROUND

Over time, microprocessors and associated components have decreased in size significantly, while their performance has dramatically increased. This is particularly the case in mobile devices. Mobile devices, such as smartphones, personal digital assistants, mobile internet devices, including automobile applications, and portable gaming devices have all evolved to require higher microprocessor and graphic performances. Each new generation of mobile processors has delivered significantly higher CPU and GPU performance while improving its architectural and power efficiency. These high performance processors have enabled significantly improved mobile computing experiences in smartphones and tablets, such as full-featured Web browsing, console class gaming, fast UI and multitasking responsiveness, and Blu-ray quality video playback.

However, maintaining a small compact form factor (height, width, and length) is an important technological goal of most, if not all, of these microprocessor devices. Even though these components are small, they generate a significant amount of heat. This heat, if not adequately dissipated or conducted away from the device, can decrease its performance and shorten its useful life. Therefore, effective heat dissipation or conduction must be achieved while adhering to a very small form factor.

SUMMARY

One aspect provides an electronics device. This embodiment comprises a printed circuit board (PCB) and an electronic component mounted to the PCB. A first thermal interface material (TIM) is attached to an upper surface of the electronic component. A heatsink that has a support base and the support base supports the heatsink on the PCB and over the electronic component. At least one biasing member having a first end is in contact with an underside of the heatsink. A thermally conductive plate is in contact with a second end of the biasing member. The thermally conductive plate has a surface area that contacts the first TIM and that is substantially larger than a surface area of the electronic component that contacts the first TIM. The thermally conductive plate is biased from the heatsink. A second TIM is located between the underside of the heatsink and the thermally conductive plate.

Another embodiment provides a mobile electronics device. This embodiment comprises a housing that has a screen associated therewith and an electronics device. The electronics device comprises a printed circuit board (PCB) and an electronic component mounted to the PCB. A first thermal interface material (TIM) is attached to an upper surface of the electronic component. A heatsink has a support base, and the support base supports the heatsink on the PCB and over the electronic component. At least one biasing member having a first end is in contact with an underside of the heatsink. A thermally conductive plate is in contact with a second end of the biasing member. The thermally conductive plate has a surface area that contacts the first TIM and that is substantially larger than a surface area of the electronic component that contacts the first TIM. The thermally conductive plate is biased from the heatsink. A second TIM is located between the underside of the heatsink and the thermally conductive plate.

Another embodiment provides a method of manufacturing embodiments of the electronics device, as discussed herein. One embodiment of the method comprises providing a printed circuit board (PCB), mounting an electronic component onto the PCB, attaching a first thermal interface material (TIM) to an upper surface of the electronic component, attaching a second TIM to an underside of a heatsink, and placing a heatsink on the PCB. The heatsink includes a support base that supports the heatsink on the PCB. When placed on the PCB, the heatsink is located over the electronic component. A first end of at least one biasing member contacts an underside of the heatsink, and a thermally conductive plate contacts a second end of the biasing member. The biasing member biases a surface of the thermally conductive plate toward the first TIM. The surface of the thermally conductive plate has a surface area that contacts the first TIM and that is substantially larger than the surface area of the electronic component that contacts the first TIM. A second TIM is located between the underside of the heatsink and the thermally conductive plate.

BRIEF DESCRIPTION OF DRAWINGS

Reference is now made to the following descriptions taken in conjunction with the accompanying drawings, in which.

DETAILED DESCRIPTION

Figure 1:
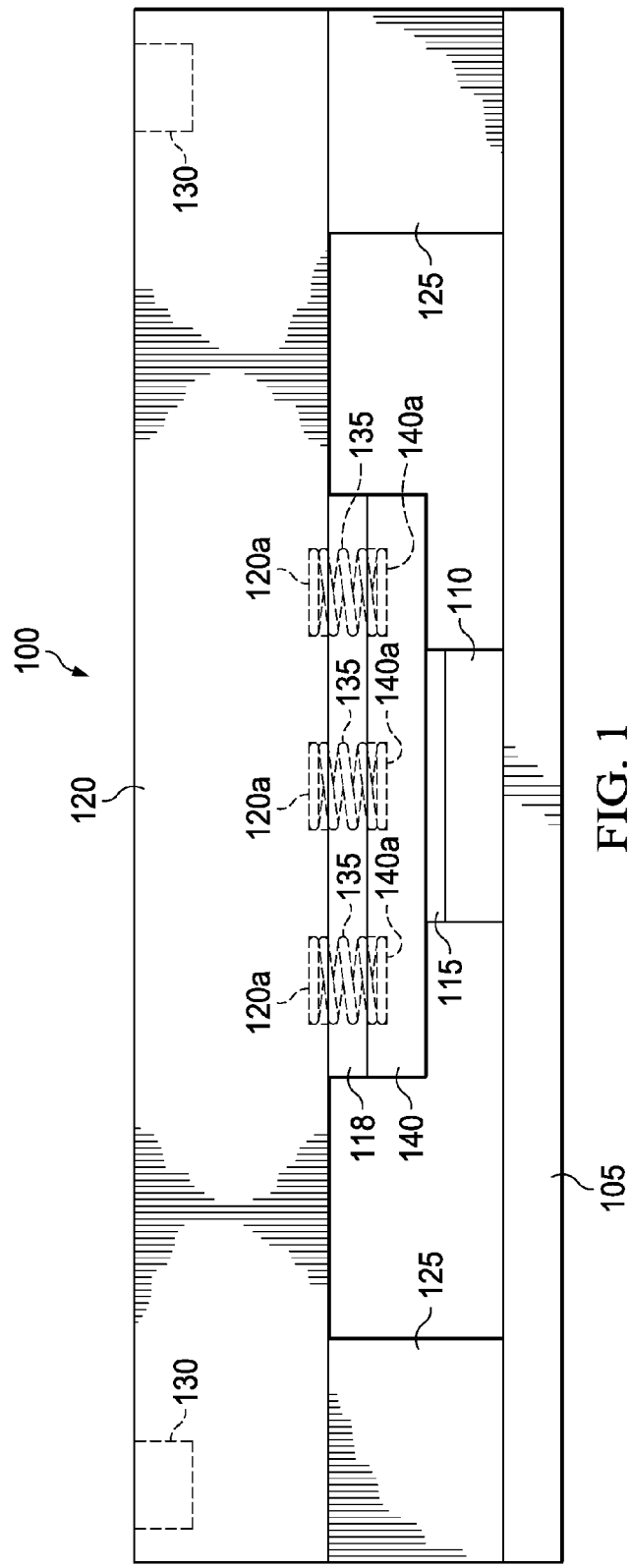
FIG. 1 illustrates an embodiment of an electronics device having an internally die-referenced thermal transfer plate and associated heatsink supported on a PCB.

In the drawings and descriptions that follow, like parts are typically marked throughout the specification and drawings with the same reference numerals, respectively. The drawn figures are not necessarily to scale. Certain features of this disclosure may be shown exaggerated in scale or in somewhat schematic form and some details of conventional elements may not be shown in the interest of clarity and conciseness. Specific embodiments are described in detail and are shown in the drawings; with the understanding that they serve as examples and that, they do not limit the disclosure to only the illustrated embodiments. Moreover, the different teachings of the embodiments discussed, below, may be employed separately or in any suitable combination to produce desired results.

Unless otherwise specified, any use of any form of the terms "connect," "engage," "couple," "attach," or any other term describing an interaction between elements is not meant to limit the interaction to direct interaction between the elements but include indirect connection or interaction between the elements described, as well. As used herein and in the claims, the phrase "configured" means that recited components has the requisite physical structure(s) that is/are necessary to accomplish the stated function.

In the following discussion and in the claims, the terms "including" and "comprising" are used in an open-ended fashion, and thus should be interpreted to mean "including, but not limited to." Further, any references to "first," "second," etc. do not specify a preferred order of method or importance, unless otherwise specifically stated, but such terms are intended to distinguish one element from another. For example, a first element could be termed a second element, and, similarly, a second element could be termed a first element, without departing from the scope of example embodiments. Moreover, a first element and second element may be implemented by a single element able to provide the necessary functionality of separate first and second elements.

FIG. 1 illustrates an embodiment of an electronics device 100 covered by this disclosure that has an internally die-referenced thermal transfer plate and improved heat dissipation features. The illustrated embodiment comprises a conventional printed circuit board (PCB). As typical with convention PCBs, the PCB 105 includes conductive traces and interconnects that electrically connect the components that are mounted on the PCB together in an operative fashion. An electronic component 110 is mounted to the PCB 105. The electronic component 110, may be any type of heat generating or heat dissipating component electronic component, such as an integrated circuit (IC), in general, or a microprocessor, analog circuits, digital circuits, other similar types of semiconductor devices, or combinations thereof. In one embodiment, the electronic component 110 is a silicon on chip (SoC) system. A SoC is an integrated circuit (IC) that integrates all components of a computer or other electronic system into a single chip. It may contain digital, analog, mixed-signal, and often radio frequency functions, as well as a graphics processor unit (GPU), on a single chip substrate. SoCs are very common in the mobile electronics market because of their low power-consumption. A typical application is in the area of embedded systems. Typically, SoCs are used for powerful processors, such as those located in smartphones. These SoCs are capable of running software, such as the desktop versions of Windows and Linux, which need external memory chips (flash, RAM) to be useful, and which use with various external peripherals.

In one embodiment, the SoC integrates an ARM architecture (conventionally known as an Acorn RISC Machine or Advanced RISC Machine), central processing unit (CPU), graphics processing unit (GPU), northbridge, southbridge, and memory controller into one package. A northbridge, or host bridge, is one of two chips in a core logic chipset architecture, which are located on a PC motherboard. Unlike the southbridge, the northbridge is typically connected directly to the CPU via the front-side bus (FSB) and is responsible for tasks that require the highest performance. The northbridge is usually paired with the southbridge, also known as I/O controller hub.

The southbridge, the other of the two chip core logic chipset, typically implements the slower capabilities of the motherboard in a northbridge/southbridge chipset computer architecture. In embodiments where they are included, these two chips manage communications between the CPU and other parts of the motherboard, and constitute the core logic chipset of the PC motherboard.

In one embodiment, the above-mentioned memory controller is a digital circuit that often manages the flow of data going to and from the computer's main memory. A memory controller can be a separate chip or integrated into another chip, such as being placed on the same die or as an integral part of a microprocessor; in the latter case, it is usually called an integrated memory controller (IMC). A memory controller is sometimes referred to as a memory chip controller (MCC) or a memory controller unit (MCU).

The illustrated embodiment of the electronics device 100 further includes a first thermal interface material (TIM) 115 that is attached to an upper surface of the electronic component 110 and a second TIM 118 attached to an underside of a heatsink, as described below. The upper surface of the electronic component 110 is the surface opposite the surface of the electronic component 110 that is attached to the PCB 105. The TIM 115 may be attached to the upper surface by conventional means, such as the inherent adhesive properties of the material. In other embodiments, however, the TIM 115 may be attached to either the upper surface of the electronic component 110 or the lower surface of a thermally conductive plate. The TIMs 115 and 118 may be any material that enhances the thermal coupling between two components. The TIMs enhance heat dissipation from the electronic component 110. As is well known, a thermal interface material essentially changes the thermal path between rough-surfaced solids from conduction through point contacts and air to conduction entirely through solids, and an important property of any TIM is its thermal conductivity (k) as it relates to resistance. The thermal resistance (R) of a TIM is equal to the thickness (t) divided by the materials conductivity (k) expressed in Watts/meter-Kelvin, times its area (A) and is often expressed by the following well-known equation: $R=t/kA$. As used herein and in the claims "thickness" means the smallest of the three dimensions of the recited component.

There are several kinds of TIMs with different target applications that may be used in the embodiments described herein. For example, the TIM may be thermal grease, which is often used in the electronics industry. The thermal grease allows a very thin bond line and therefore a very small thermal resistance. It typically has no mechanical strength (other than the surface tension of the grease and the resulting adhesive effect). Because it does not cure, it is typically used in those applications where the material can be contained or in thin applications where the viscosity of the grease will allow it to stay in position during use.

Another example of a TIM is thermal glue, which allows a very thin bond line but will additionally provide some mechanical strength to the bond after curing. Thermal glue allows a thicker bond line than the thermal grease as it cures. The TIM may also be a thermal gap filler, which can be described as "curing thermal grease" or "non-adhesive thermal glue". It allows thicker bond lines than the thermal grease as it cures, while still allowing an easy disassembly, given its limited adhesiveness. Another type of thermal material that may be used is a thermal pad. In contrast to the previously discussed TIMs, a thermal pad does not come in liquid or paste form but in soft, solid state. It is mostly comprised of Silicone or silicone-like material. It is easy to apply, and it can allow thicker bond lines but will usually need higher force to press the heatsink on the heat source so that the thermal pad conforms to the bonded surfaces. Another alternative that may be used is a thermal adhesive, which is essentially a thermal pad with adhesive properties. The TIM may also be a conventional phase change material that is similar to thermal grease and which is commercially available, but has a higher viscosity at low temperatures to help the material stay in place.

The thickness of the TIM 118 may vary to a degree within design limits of the device, and its thickness may depend on the dimensional variation of other components in the electronics device 100. The thickness of TIM 115 is minimized and allows the gap tolerance to accumulate at TIM 118. All components in the electronics device 100 will have variations in their dimensions due to manufacturing limitations. For example, the thickness of the thermally conductive plate 140 may have a nominal thickness of about 2 mm with dimensional tolerances ranging from a minimum of about 1.9 mm to a maximum of about 2.1 mm. The dimensional tolerance accumulates at TIM 118. In one embodiment, the TIM 118 provides a TIM thickness that may be about 0.5 mm when all the components are at their nominal dimensions. When all the components are at their maximum dimensions, the TIM thickness may be about 0.2 mm, and yet when all the components are at their minimum dimensions, the TIM thickness may be about 1 mm. In one embodiment, the TIM 115 and the TIM 118 are compressible materials, such that their thickness may change in a final assembled device when compressed, as explained below. In one embodiment, the thickness of the TIM 115 may be about 100 microns or less.

The electronics device 100 also comprises a heatsink 120 that has a support base 125. The support base 125 supports the heatsink 120 on the PCB 105 and locates the heatsink 120 over the electronic component 110. The support base 125 may be integrally formed with the heatsink 120, or in another embodiment, it may be attached to the heatsink 120 by known mechanical means, such as by screws or spring clamps. Additionally, the support base 125 may be separate legs located on opposing sides of the heatsink 120 or may be a base member that extends around the perimeter of the heatsink 120. The heatsink 120 may otherwise be of conventional design and material in that it may be metallic and include a number of fins for thermally conducting the heat from the heatsink 120. In some embodiments, the heatsink 120 may include attachment points 130 that can be used to attach an auxiliary heatsink (not shown) to the heatsink 120. For example, the attachment points 130 may be threaded screw holes or indentions that can be used in conjunction with a spring clamp mechanism. It should be noted that since the heatsink 120 is supported by the PCB 105 and not by the electronic component 110, the overall stress on the electronic component 110 is reduced. This configuration also allows auxiliary heatsinks to be attached to the heatsink 120 without adding additional mechanical stress to the SoC (e.g., electronic component 110).

The electronics device 100 further comprises at least one biasing member 135 that has a first end or side that contacts an underside of the heatsink 120, which is the side of the heatsink 120 that faces the upper surface of the electronic component 110 when the respective components are positioned on the PCB 105. As used herein and in the claims, a biasing member is an elastic object used to store mechanical energy and that is capable of exerting a biasing force, as discussed herein. The materials used to construct the biasing member may vary. For example, the biasing member may be made from steel, thermo plastics, or other moldable types of materials from which springs are typically fabricated. However, the material selected must be able to withstand operating temperatures typically associated with the electronic component 110. In one embodiment, the biasing member or members 135 may be helical springs as shown, or one or more leaf springs may be used. As used herein and in the claims, "contact or contacts" include those instances where the biasing member 135 merely physically contacts the recited component or is attached by mechanical or frictional means to the recited components. The biasing member(s) 135 is/are configured to exert a biasing force toward the electronic component 110. In some embodiments, a portion of the biasing member 135 may be received in a cavity 120a formed in the underside of the heatsink 120. In other cases, it may be mechanically attached, such as by a screw or weld, to the underside of the heatsink 120. When properly positioned, the biasing member 135 exerts a biasing force towards the electronic component 110 and the TIM 115. When a single biasing member 135 is utilized in the electronics device 100, it will be located to balance the biasing force across the device. However, in other embodiments, the electronics device 100 may include a plurality of biasing members 135, as shown in the illustrated embodiment of FIG. 1. In such embodiments, the biasing members 135 are distributed to create equal biasing forces across the TIM 115.

The electronics device 100 further includes a thermally conductive plate 140 that contacts a second end or side of the biasing member 135 or biasing members when a plurality is present. The TIM 118 may be attached to the upper side (i.e. side facing the underside of the heatsink 120 when assembled), or it may be attached to the underside of the heatsink 120. The TIM 118 will have one or more openings to accommodate the passage of the biasing members(s) 135 therethrough. In an embodiment, the biasing member 135 may be received within a cavity 140a that is formed in the upper surface of the thermally conductive plate 140. The thermally conductive plate 140 has a surface area that contacts the first TIM 115 and that is substantially larger than a surface area of the electronic component 110 that contacts the first TIM 115. As used herein and in the claims, "surface area" means the area of a surface of the recited component that contacts a surface of the other recited component. The thermally conductive plate 140 is biased from the heatsink 120. The phrase "biased" as used herein and in the claims means that the biasing member(s) 135 create a biasing force against the conductive plate 140, which in turn creates a biasing force against the TIM 115, when the electronics device 100 is assembled. The pressing of the conductive plate 140 against the TIM 115 compresses the TIM 115 and decreases its thickness, which decreases the thermal resistance, and increases the overall thermal heat transfer from the electronic component 110 without creating undue weight associated stress on the electronic component 110.

The larger conductive plate 140 provides more surface area for greater heat transfer from the conductive plate 140 through TIM 118. In one embodiment, the ratio of areas of the thermally conductive plate 140 and the electronic component 110 ranges from about 2:1 to about 10:1, and in one aspect of this embodiment, the ratio ranges from about 5:1 to about 6:1.

Figure 2:
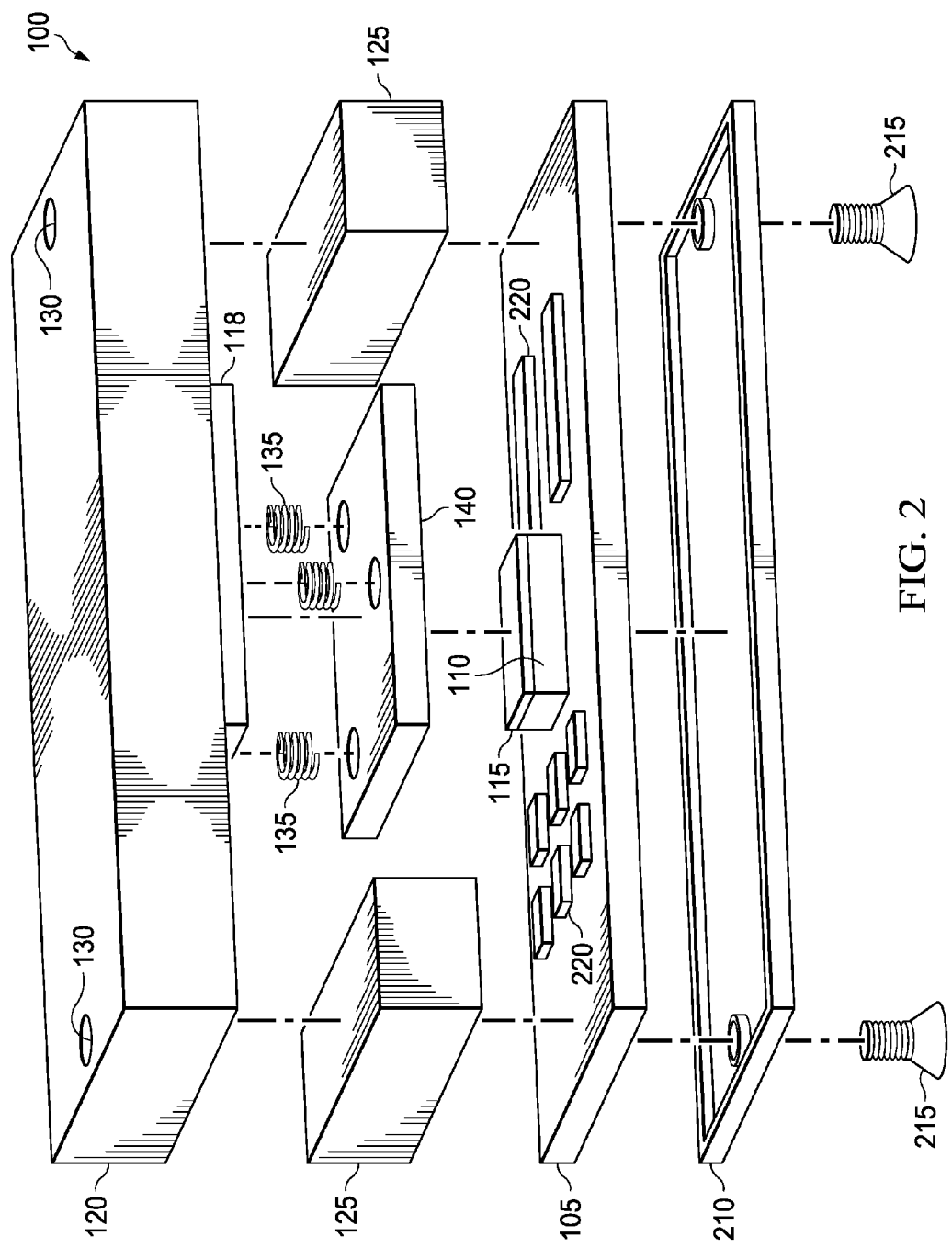
FIG. 2 illustrates an exploded view of an embodiment of an electronics device having an internally die-referenced thermal transfer plate and associated heatsink supported on a PCB.

FIG. 2 illustrates an exploded view of another embodiment of the electronics device 100 of FIG. 1. This embodiment illustrates the second TIM 118 attached to the underside of the heatsink 120 and is located between the underside of the heatsink 120 and the thermally conductive plate 140. The thickness of the second TIM 118 may vary, depending on the manufacturing tolerance stackup requirements. In one aspect of this embodiment, the second TIM 118 has a thickness that is about three times thicker than a thickness of the first TIM 115. In one aspect of this embodiment, the thickness of the second TIM 118 may be about 0.5 mm and the thickness of the first TIM 115 may be about 100 microns.

In an embodiment, the second TIM 118 has a footprint, as defined by its outer perimeter that is, about equal to a footprint of the conductive plate 140, as defined by its outer perimeter. The overall thermal resistance is improved in the electronic device 100, even in view of the thicker second TIM 118, because of the increased surface area of the second TIM 118 over that of the first TIM 115. For example, in one embodiment, the total resistance of the first and second TIMs 115 and 118 is about 0.36° C./watts, which is a significant improvement over conventional devices that may have a total thermal resistance of 2.0° C./watts or more. The second TIM 118 will have one or more openings through it to accommodate passage of one or more of the biasing members 135. The arrangement of the underside of the heatsink 120, the second TIM 118, and the conductive plate 140 is such that they remain in contact with each other to promote thermal transfer from the electronic component 110, even as the conductive plate 140 is biased against the first TIM 115.

In another embodiment, the electronics device 100 may further include a back stiffener 210 conventionally attached (such as by screws 215) to an underside of the PCB 105 that provides additional mechanical and structural support to the electronics device 100. Additionally, other conventional electrical components 220, such as memory blocks, wireless or wired communication circuitry, and auxiliary CPUs, or GPUs may be present in the electronics device 100.

Figure 3B:
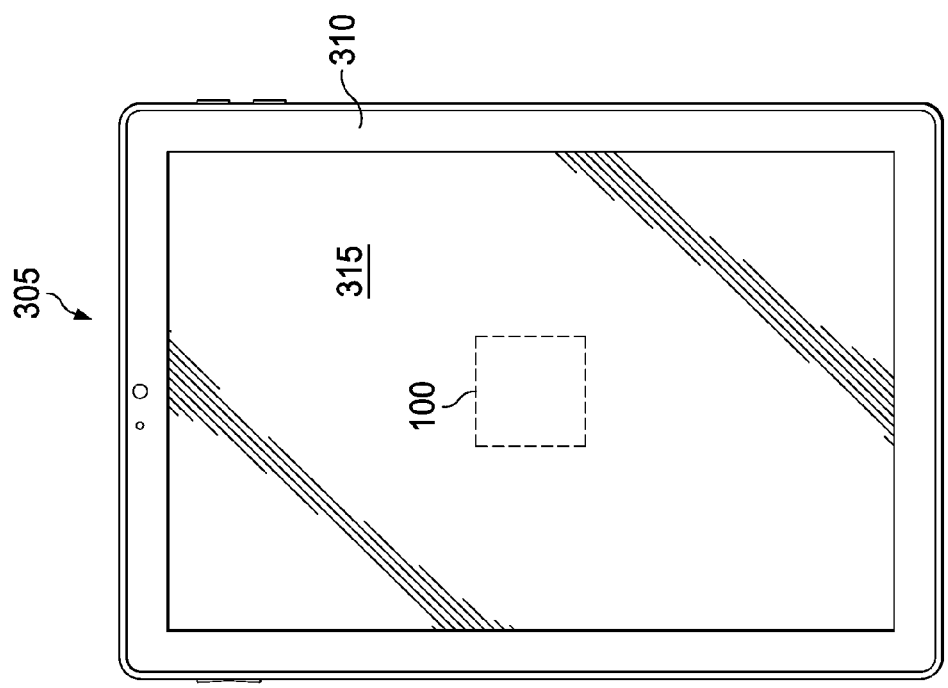
FIG. 3B illustrates another embodiment of a mobile device in which the embodiments of an electronics device having an internally die-referenced thermal transfer plate.
Figure 3A:
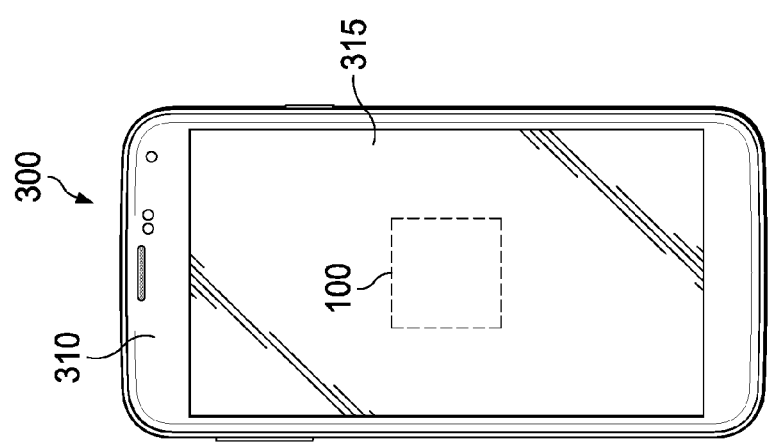
FIG. 3A illustrates an embodiment of a mobile device in which the embodiments of an electronics device having an internally die-referenced thermal transfer plate may be implemented.

FIGS. 3A-3B illustrate other embodiments where the electronic device 100 is implemented in a mobile electronics device 300 or 305. The mobile electronics device 100 may have a number of different configurations. For example, the mobile electronics device 100 may be a smartphone, a personal digital assistant, a tablet, a mobile gaming device, or an automotive application. The illustrated embodiments 300, 305 comprise a housing 310 that has a screen 315 associated therewith and includes the various embodiments of the electronics device 100, as discussed above. It should be understood that these mobile devices 300, 305 also include other conventional electrical components (not shown), such as wireless communication components, memory, and other auxiliary processing components that are necessary to achieve an operative, robust device. For illustrative purposes only, mobile device 300 may be a smartphone that may be used for gaming purposes or other high graphics applications, while mobile device 305 may be a smart tablet, personal computer, or control console and screen display in an automobile. The number of applications of the electronics device 100 is growing and includes graphics applications for personal computers, gaming systems, and home theaters on the go. Additionally, the embodiments of the electronics device 100 provide the necessary power and flexibility to develop and deploy artificial intelligence (AI) systems for self-driving vehicles. The unified AI computing architecture enables training deep neural networks in the data center and then seamlessly runs them on the mobile device 300 or 305 inside the vehicle. This end-to-end approach leverages applicable software and allows cars to receive over-the-air updates to add new features and capabilities throughout the life of a vehicle.

Thus, the embodiments described herein provide an electronics device that effectively removes heat from the SoC, which increases its efficiency and extends its useful life by spreading heat in the thermally conductive plate 140 before transferring it across the interface. Surface area is a significant factor in TIM thermal performance, so this increases the performance substantially when using the same type of TIM pad. This allows the use of lower performance TIM pads that resolve the issues of high die pressure and non-resilient behavior of high thermal conductivity TIMs. Alternatively, this allows the use of high performance TIMS like greases or phase change materials for Tim 115, and lower performance TIMS for coast savings for TIM 118. Additionally, these embodiments mechanically isolate the SoC from the heatsink, which reduces stress, increases reliability, and provides improved thermal performance when compared to conventional board referenced heatsinks.

Figure 4:
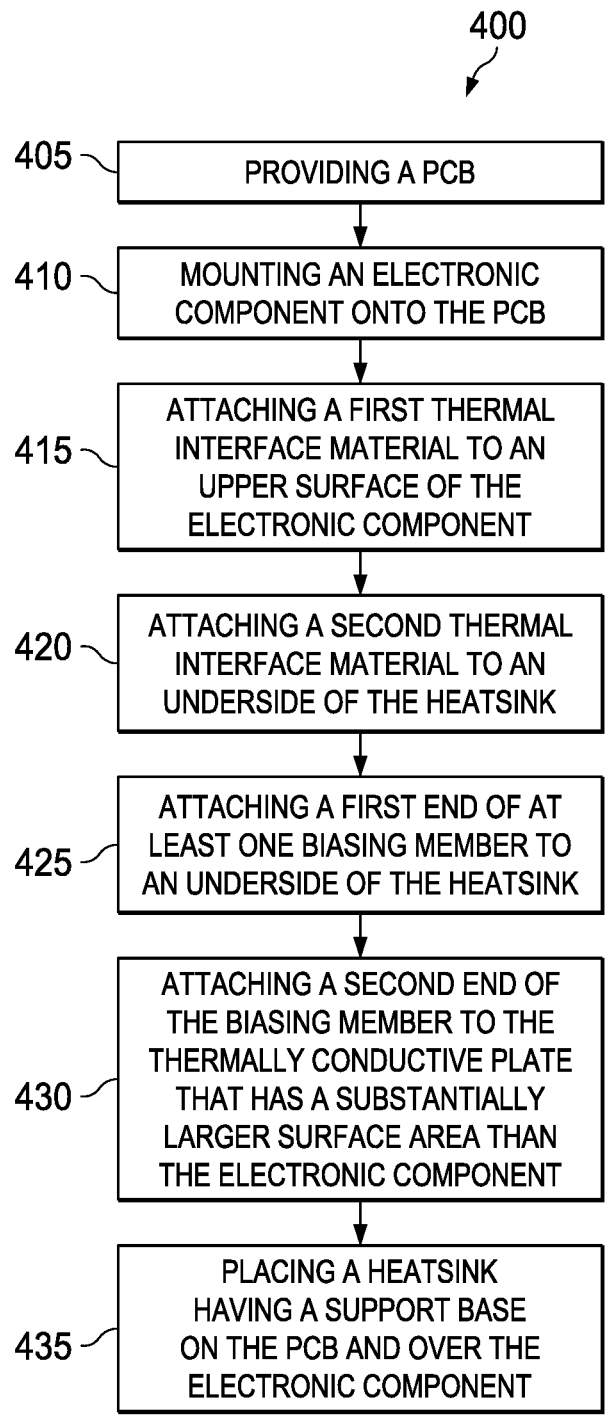
FIG. 4 illustrates a flow chart of an embodiment of a method for manufacturing an electronics device having an internally die-referenced thermal transfer plate.

FIG. 4 illustrates a flow chart of a method embodiment 400 that can be used to fabricate an embodiment of the electronics device 100. In step 405, this embodiment comprises providing a printed wiring board (PCB). It should be understood that "providing" includes situations where the PCB is manufactured through in-house processes or obtained from an out-side or third party source. In step 410, the electronic component is mounted onto the PCB, and in step 415, a first thermal interface material (TIM) is attached to an upper surface of the electronic component. In step 420, a second TIM is attached to an underside surface of the heatsink. In step 425, a first end of the biasing member is attached to an underside of the heatsink, and in step 430, a second end of the biasing member is attached to the thermally conductive plate. The biasing member biases a surface of the thermally conductive plate toward the first TIM. The surface of the thermally conductive plate has a surface area that contacts the first TIM and that is substantially larger than a surface area of the electronic component that contacts the first TIM. In one embodiment, the ratio of areas of the thermally conductive plate and the electronic component ranges from about 2:1 to about 10:1, and in one aspect of this embodiment, the ratio ranges from about 5:1 to about 6:1. In step 430, a heatsink, having a support base, is placed on the PCB and over the electronic component and is supported above the electronic component by the support base. Another embodiment of the method includes attaching a second TIM to the underside of the heatsink to locate the second TIM between the underside of the heatsink and the thermally conductive plate. In one embodiment of the method, the second TIM has a thickness that is about two to 10 thicker than the first TIM.

Those skilled in the art to which this application relates will appreciate that other and further additions, deletions, substitutions and modifications may be made to the described embodiments.

What is claimed is:

1. An electronics device, comprising:
a printed circuit board (PCB);
an electronic component mounted to said PCB;
a first thermal interface material (TIM) attached to an upper surface of said electronic component;
a heatsink having a support base, said heatsink supported on said PCB by said support base and being located over said electronic component;
at least one biasing member having a first end in contact with an underside of said heatsink;
a thermally conductive plate in contact with a second end of said biasing member, said thermally conductive plate having a surface area that contacts said first TIM and that is substantially larger than a surface area of said electronic component that contacts said first TIM, said thermally conductive plate being biased from said heatsink; and a second TIM attached to said underside of said heatsink and located between said underside of said heatsink and said thermally conductive plate.

2. The electronics device of claim 1, wherein a ratio of surface areas of said thermally conductive plate and said electronic component ranges from about 2:1 to about 10:1.

3. The electronics device of claim 2, wherein said ratio ranges from about 5:1 to about 6:1.

4. The electronics device of claim 1, wherein a thickness of said second TIM is about 2 times to about 10 times thicker than a thickness of said first TIM.

5. The electronics device of claim 4, wherein said second TIM has a thickness that is about three times thicker than a thickness of said first TIM.

6. The electronics device of claim 5, wherein said thickness of said second TIM is about 0.5 mm and said thickness of said first TIM is about 100 microns.

7. The electronics device of claim 1, wherein a total resistance of said first and second TIMS is about 0.36° C./watt.

8. The electronics device of claim 1 further comprising a back stiffener attached to an underside of said PCB.

9. A mobile electronics device, comprising:
  a housing, said housing have a screen associated therewith; and
  an electronic device, comprising:
    a printed circuit board (PCB);
    an electronic component mounted to said PCB;
    a first thermal interface material (TIM) attached to an upper surface of said electronic component;
    a heatsink having a support base, said heatsink supported on said PCB by said support base and being located over said electronic component;
    at least one biasing member having a first end attached to an underside of said heatsink;
    a thermally conductive plate attached to a second end of said biasing member, said thermally conductive plate having a surface area that contacts said first TIM and that is substantially larger than a surface area of said electronic component that contacts said first TIM, said thermally conductive plate being biased from said heatsink; and
    a second TIM attached to said underside of said heatsink and located between said underside of said heatsink and said thermally conductive plate.

10. The electronics device of claim 9, wherein a ratio of surface areas of said thermally conductive plate and said electronic component ranges from about 2:1 to about 10:1.

11. The electronics device of claim 10, wherein said ratio ranges from about 5:1 to about 6:1.

12. The electronics device of claim 9, wherein a thickness of said second TIM is about 2 times to about 10 times thicker than a thickness of said first TIM.

13. The electronics device of claim 12, wherein said thickness of said second TIM is about three times thicker than a thickness of said first TIM.

14. The electronics device of claim 13, wherein said thickness of said second TIM is about 0.5 mm and said thickness of said first TIM is about 100 microns.

15. The electronics device of claim 9 further comprising a back stiffener attached to an underside of said PCB.

16. A method of manufacturing an electronics device, comprising:
  providing a printed circuit board (PCB);
  mounting an electronic component on said PCB;
  attaching a first thermal interface material (TIM) to an upper surface of said electronic component;
  attaching a second TIM to an underside of a heatsink;
  placing said heatsink having a support base on said PCB, said heatsink being located over and being supported above said electronic component by said support base;
  contacting a first end of at least one biasing member with an underside of said heatsink; and
  contacting a thermally conductive plate with a second end of said biasing member, said biasing member biasing a surface or said thermally conductive plate toward said first TIM, said surface of said thermally conductive plate having a surface area that contacts said first TIM and that is substantially larger than a surface area of said electronic component that contacts said first TIM.

17. The method of claim 16, wherein a ratio of surface area of said thermally conductive plate and said electronic component ranges from about 2:1 to about 10:1.

18. The method of claim 17, wherein said ratio ranges from about 5:1 to about 6:1.

19. The method of claim 16, wherein a thickness of said second Tim is about 2 times to about 10 times thicker than a thickness of said first TIM.

20. The method of claim 19, wherein said thickness of said second TIM that is about three times thicker than a thickness of said first TIM.

* * * * *

UNITED STATES PATENT AND TRADEMARK OFFICE
CERTIFICATE OF CORRECTION

PATENT NO. : 9,775,229 B1
APPLICATION NO. : 15/414902
DATED : September 26, 2017
INVENTOR(S) : David Haley and Carlo Galutera Page 1 of 1

It is certified that error appears in the above-identified patent and that said Letters Patent is hereby corrected as shown below:

In the Claims

In Claim 9, Column 9, Line 25, after --said housing-- delete "have" and insert --having--

In Claim 19, Column 10, Line 41, after --second-- delete "Tim" and insert --TIM--

Signed and Sealed this
Twenty-fourth Day of July, 2018

Andrei Iancu
*Director of the United States Patent and Trademark Office*